United States Patent
Han et al.

(10) Patent No.: US 10,691,911 B2
(45) Date of Patent: Jun. 23, 2020

(54) ARRAY SUBSTRATE, DISPLAY PANEL, DISPLAY DEVICE AND METHOD FOR MANUFACTURING ARRAY SUBSTRATE

(71) Applicant: BOE TECHNOLOGY GROUP CO., LTD., Beijing (CN)

(72) Inventors: Yanling Han, Beijing (CN); Xue Dong, Beijing (CN); Haisheng Wang, Beijing (CN); Chunwei Wu, Beijing (CN); Xiaoliang Ding, Beijing (CN); Yingming Liu, Beijing (CN); Yuzhen Guo, Beijing (CN); Chihjen Cheng, Beijing (CN); Changfeng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 133 days.

(21) Appl. No.: 15/770,644

(22) PCT Filed: Oct. 12, 2017

(86) PCT No.: PCT/CN2017/105831
§ 371 (c)(1),
(2) Date: Apr. 24, 2018

(87) PCT Pub. No.: WO2018/176796
PCT Pub. Date: Oct. 4, 2018

(65) Prior Publication Data
US 2019/0095015 A1    Mar. 28, 2019

(30) Foreign Application Priority Data

Mar. 28, 2017   (CN) .......................... 2017 1 0192938

(51) Int. Cl.
*G06K 9/00*    (2006.01)
*G06F 3/041*    (2006.01)
(Continued)

(52) U.S. Cl.
CPC .......... *G06K 9/0002* (2013.01); *G06F 3/043* (2013.01); *G06F 3/0412* (2013.01);
(Continued)

(58) Field of Classification Search
CPC .......... G06K 9/00006; G06K 9/00013; G06K 9/0002
See application file for complete search history.

(56) References Cited

U.S. PATENT DOCUMENTS 9,697,345 B2 *   7/2017   Mo .......................... G06F 21/32
10,169,633 B2 *  1/2019   Mo ....................... G06K 9/0002
(Continued)

FOREIGN PATENT DOCUMENTS

CN    104835439 A    8/2015
CN    105046243 A    11/2015
(Continued)

OTHER PUBLICATIONS

International Search Report and Written Opinion for PCT Appl. No. PCT/CN2017/105831, dated Jan. 16, 2018.
(Continued)

*Primary Examiner* — Patrick F Marinelli
(74) *Attorney, Agent, or Firm* — Foley & Lardner LLP

(57) ABSTRACT

The present application provides in some embodiments an array substrate, a display panel, a display device and a method for manufacturing the array substrate. The present application provides in some embodiments an array substrate, the array substrate comprising: an ultrasonic emission sensor, a substrate over the ultrasonic emission sensor, a pixel circuit layer over the glass substrate, and an ultrasonic reception sensor over the TFT pixel circuit layer, the ultrasonic reception sensor being electrically connected to the pixel circuit layer, wherein projections of the ultrasonic emission sensor and the ultrasonic reception sensor in a
(Continued)

direction perpendicular to the substrate do not overlap with each other.

14 Claims, 6 Drawing Sheets

(51) Int. Cl.
    *H01L 27/12*            (2006.01)
    *G06F 3/043*            (2006.01)
    *H01L 41/047*          (2006.01)
    *H01L 41/113*          (2006.01)

(52) U.S. Cl.
    CPC ........ *H01L 27/1214* (2013.01); *H01L 41/047* (2013.01); *H01L 41/1132* (2013.01); *G06F 2203/04103* (2013.01)

(56) References Cited

U.S. PATENT DOCUMENTS

| | | | | |
|---|---|---|---|---|
| 2011/0316611 | A1* | 12/2011 | Gustavsson | H04R 1/1041 327/516 |
| 2014/0355376 | A1* | 12/2014 | Schneider | G01S 7/56 367/7 |
| 2015/0015515 | A1* | 1/2015 | Dickinson | G06F 3/043 345/173 |
| 2015/0063663 | A1 | 3/2015 | Wu et al. | |
| 2015/0168503 | A1* | 6/2015 | Kim | G01R 33/0286 324/244 |
| 2015/0324625 | A1* | 11/2015 | Mo | G06F 21/32 382/124 |
| 2016/0026843 | A1* | 1/2016 | Mo | G06K 9/0002 382/124 |
| 2016/0181951 | A1* | 6/2016 | Qiu | F03G 7/002 606/1 |
| 2017/0053150 | A1* | 2/2017 | Lee | G06K 9/0002 |
| 2017/0110504 | A1* | 4/2017 | Panchawagh | H01L 27/20 |
| 2017/0182852 | A1* | 6/2017 | Makin | B60C 23/0469 |
| 2017/0293378 | A1* | 10/2017 | Ahn | G06F 3/044 |
| 2017/0363581 | A1* | 12/2017 | Makin | G01N 29/04 |
| 2018/0196988 | A1* | 7/2018 | Tse | G06K 9/00087 |
| 2018/0323783 | A1* | 11/2018 | Bang | G01S 15/04 |
| 2018/0329558 | A1* | 11/2018 | Park | G06F 3/0414 |
| 2018/0349665 | A1* | 12/2018 | He | B06B 1/0622 |
| 2018/0375010 | A1* | 12/2018 | Kishimoto | B06B 1/0603 |
| 2019/0009302 | A1* | 1/2019 | Zheng | B06B 1/0644 |
| 2019/0057236 | A1* | 2/2019 | Liu | G06K 9/0002 |
| 2019/0074833 | A1* | 3/2019 | Sheng | H03K 17/964 |
| 2019/0095015 | A1* | 3/2019 | Han | G06F 3/0412 |
| 2019/0095046 | A1* | 3/2019 | Guo | G06F 3/043 |

FOREIGN PATENT DOCUMENTS

| | | |
|---|---|---|
| CN | 106250834 A | 12/2016 |
| CN | 106951130 A | 7/2017 |

OTHER PUBLICATIONS

First Office Action for CN Appl. No. 201710192938.1, dated Feb. 26, 2019.

* cited by examiner

ARRAY SUBSTRATE, DISPLAY PANEL, DISPLAY DEVICE AND METHOD FOR MANUFACTURING ARRAY SUBSTRATE

CROSS-REFERENCE TO RELATED APPLICATIONS

The present application claims priority under 35 U.S.C. § 371 to International Patent Application No. PCT/CN2017/105831 filed on Oct. 12, 2017, which claims priority to the Chinese Patent Application No. 201710192938.1 filed on Mar. 28, 2017, the disclosure of each of which is incorporated into the present disclosure by reference for all purposes.

TECHNICAL FIELD

The present application relates to an array substrate, a display panel, a display device and a method for manufacturing the array substrate.

BACKGROUND

In related technologies, a silicon-based ultrasonic transducer micro-electro-mechanical system (MEMS) array is used for receiving and transmitting ultrasonic waves, detecting the position of a gesture and identifying the gesture. An integration of gesture identification with a display device is a module integration based on the silicon-based MEMS array and a complementary metal oxide semiconductor integrated circuit (CMOS IC).

In summary, in related technologies, functional modules for identifying a gesture are built completely externally and not integrated with a display screen.

SUMMARY

The present application provides in some embodiments an array substrate, a display panel, a display device and a method for manufacturing the array substrate.

The present application provides in some embodiments an array substrate, the array substrate including a display area and a non-display area, the array substrate comprising: an ultrasonic emission sensor, a substrate over the ultrasonic emission sensor, a pixel circuit layer over the substrate, and an ultrasonic reception sensor over the pixel circuit layer, the ultrasonic reception sensor being electrically connected to the pixel circuit layer, wherein projections of the ultrasonic emission sensor and the ultrasonic reception sensor in a direction perpendicular to the substrate do not overlap with each other.

According to an array substrate provided by some embodiments of the present application, an ultrasonic emission sensor is provided on a back surface of the substrate, a pixel circuit layer is provided on a front surface of the substrate, and an ultrasonic reception sensor is provided over the pixel circuit layer, such that the gesture-identifying and/or fingerprint-identifying ultrasonic sensor is integrated with the array substrate. Thus, it is unnecessary to provide apparatuses or modules in addition to the array substrate for gesture identification. In addition to a display function, the array substrate can also identify a gesture and/or fingerprint, thereby increasing the additional value in utility of the array substrate.

In some embodiments, the ultrasonic emission sensor comprises: a first drive electrode layer, a first piezoelectric layer over the first drive electrode layer, and a second drive electrode layer over the first piezoelectric layer.

In some embodiments, a material of the first piezoelectric layer in the display area is the same as a material of the first piezoelectric layer in the non-display area, and a thickness of the first piezoelectric layer in the display area is less than a thickness of the first piezoelectric layer in the non-display area.

According to an array substrate provided by some embodiments of the present application, the piezoelectric ultrasonic sensor in the display area and the piezoelectric ultrasonic sensor in the non-display area are made of the same material, and a thickness of the piezoelectric ultrasonic sensor in the non-display area is larger than that of the piezoelectric ultrasonic sensor in the display area, such that the piezoelectric ultrasonic sensor in the display area has an innate frequency higher than that of the piezoelectric ultrasonic sensor in the non-display area, thereby enabling fingerprint identification in the display area and gesture identification in the non-display area. That is, the array substrate can realize two functions, i.e., fingerprint identification and gesture identification. Furthermore, integration of the ultrasonic sensor for fingerprint identification and the ultrasonic sensor for gesture identification with the array substrate further increases the additional value in utility of the array substrate.

In some embodiments, a thickness of the first piezoelectric layer in the display area is the same as a thickness of the first piezoelectric layer in the non-display area, and a material of the first piezoelectric layer in the display area has a frequency constant larger than that of a material of the first piezoelectric layer in the non-display area.

According to an array substrate provided by some embodiments of the present application, the piezoelectric ultrasonic sensor in the display area and the piezoelectric ultrasonic sensor in the non-display area have the same thickness, and a frequency constant of the piezoelectric material in the ultrasonic sensor in the non-display area is less than that of the piezoelectric material in the ultrasonic sensor in the display area, such that the piezoelectric ultrasonic sensor in the display area has an innate frequency higher than that of the piezoelectric ultrasonic sensor in the non-display area, thereby enabling fingerprint identification in the display area and gesture identification in the non-display area. That is, the array substrate can realize two functions, i.e., fingerprint identification and gesture identification. Furthermore, integration of the ultrasonic sensor for fingerprint identification and the ultrasonic sensor for gesture identification with the array substrate enables the array substrate to have the two functions of fingerprint identification and gesture identification in addition to the function of displaying, which further increases the additional value in utility of the array substrate.

In some embodiments, the first drive electrode layer and the second drive electrode layer include a plurality of bar-shaped drive electrodes that are arranged in parallel with one another.

In some embodiments, the first drive electrode layer and the second drive electrode layer are planar drive electrodes.

In some embodiments, the ultrasonic reception sensor comprises: a first sensing electrode layer, a second piezoelectric layer over the first sensing electrode layer, and a second sensing electrode layer over the second piezoelectric layer.

In some embodiments, the first piezoelectric layer and the second piezoelectric layer are made of the same material and have the same thickness.

In some embodiments, a material of the second piezoelectric layer in the display area is the same as a material of the second piezoelectric layer in the non-display area, and a thickness of the second piezoelectric layer in the display area is less than a thickness of the second piezoelectric layer in the non-display area.

According to an array substrate provided by some embodiments of the present application, the piezoelectric ultrasonic sensor in the display area and the piezoelectric ultrasonic sensor in the non-display area are made of the same material, and a thickness of the piezoelectric ultrasonic sensor in the non-display area is larger than that of the piezoelectric ultrasonic sensor in the display area, such that the piezoelectric ultrasonic sensor in the display area has an innate frequency higher than that of the piezoelectric ultrasonic sensor in the non-display area, thereby enabling fingerprint identification in the display area and gesture identification in the non-display area. That is, the array substrate can realize two functions, i.e., fingerprint identification and gesture identification. Furthermore, integration of the ultrasonic sensor for fingerprint identification and the ultrasonic sensor for gesture identification with the array substrate enables the array substrate to have the two functions of fingerprint identification and gesture identification in addition to the function of displaying, which further increases the additional value in utility of the array substrate.

In some embodiments, a material of the second piezoelectric layer in the display area is the same as a material of the second piezoelectric layer in the non-display area, and a material of the second piezoelectric layer in the display area has a frequency constant larger than that of a material of the second piezoelectric layer in the non-display area.

According to an array substrate provided by some embodiments of the present application, the piezoelectric ultrasonic sensor in the display area and the piezoelectric ultrasonic sensor in the non-display area have the same thickness, and a frequency constant of the piezoelectric material in the ultrasonic sensor in the non-display area is less than that of the piezoelectric material in the ultrasonic sensor in the display area, such that the piezoelectric ultrasonic sensor in the display area has an innate frequency higher than that of the piezoelectric ultrasonic sensor in the non-display area, thereby enabling fingerprint identification in the display area and gesture identification in the non-display area. That is, the array substrate can realize two functions, i.e., fingerprint identification and gesture identification. Furthermore, integration of the ultrasonic sensor for fingerprint identification and the ultrasonic sensor for gesture identification with the array substrate enables the array substrate to have the two functions of fingerprint identification and gesture identification in addition to the function of displaying, which further increases the additional value in utility of the array substrate.

In some embodiments, the first sensing electrode layer and the second sensing electrode layer include a plurality of bar-shaped drive electrodes that are arranged in parallel with one another.

In some embodiments, projections of the first sensing electrode layer and the second sensing electrode layer in a direction perpendicular to the substrate overlap with a projection of the non-display area of the array substrate in the direction perpendicular to the substrate.

In some embodiments, the circuit layer comprises a thin film transistor (TFT) and a diode, in the first sensing electrode layer and the second sensing electrode layer, each pair of bar-shaped sensing electrodes whose projections overlap with each other is electrically connected to a diode in the pixel circuit.

Some of the embodiments of the present application provide a display panel, comprising an array substrate provided by some embodiments of the present application.

Some of the embodiments of the present application provide a display device, comprising a display panel provided by some embodiments of the present application.

The present application provides in some embodiments a method for manufacturing an array substrate, the method comprising: providing an ultrasonic emission sensor on a back surface of a substrate; providing a pixel circuit layer on a front surface of the substrate; providing an ultrasonic reception sensor over the pixel circuit layer, the ultrasonic reception sensor being electrically connected to the pixel circuit layer, wherein projections of the ultrasonic emission sensor and the ultrasonic reception sensor in a direction perpendicular to the substrate do not overlap with each other.

BRIEF DESCRIPTION OF THE DRAWINGS

In order to illustrate the technical solutions in some embodiments of the present application, a brief introduction will be given below for the drawings to be used in the description of the embodiments. It is evident that, the drawings illustrated as follows are merely some of the embodiments of the present application. For an ordinary technician in the art, he or she may also acquire other drawings according to such drawings on the premise that no burdensome effort is involved.

DETAILED DESCRIPTION

The present application provides in some embodiments an array substrate, a display panel, a display device and a method for manufacturing the array substrate, in which ultrasonic sensors for gesture identification and/or fingerprint identification are integrated with the array substrate, such that in addition to a display function, the array substrate can also identify a gesture and/or fingerprint, thereby increasing the additional value in utility of the array substrate.

Figure 1:
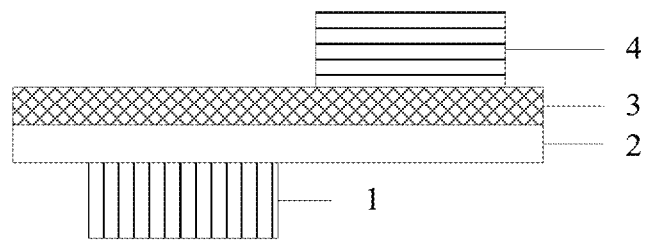
FIG. 1 is a schematic diagram showing the structure of a first array substrate provided by some embodiments of the present application.

The present application provides in some embodiments an array substrate, as shown in FIG. 1, the array substrate comprising: an ultrasonic emission sensor 1, a substrate (e.g., a glass substrate) 2 over the ultrasonic emission sensor 1, a pixel circuit layer (e.g., a thin film transistor (TFT) pixel circuit layer) 3 over the substrate 2, and an ultrasonic reception sensor 4 over the pixel circuit layer 3, the ultrasonic reception sensor being electrically connected to the pixel circuit layer 3, wherein projections of the ultrasonic emission sensor 1 and the ultrasonic reception sensor 4 in a direction perpendicular to the substrate do not overlap with each other.

According to an array substrate provided by some embodiments of the present application, an ultrasonic emission sensor is provided on one surface of the substrate, a pixel circuit layer is provided on the other surface of the substrate, and an ultrasonic reception sensor is provided over the pixel circuit layer, such that the gesture-identifying and/or fingerprint-identifying ultrasonic sensors are integrated with the array substrate. Thus, it is unnecessary to provide apparatuses or modules in addition to the array substrate for gesture identification and/or fingerprint identification. In addition to a display function, the array substrate can also identify a gesture and/or fingerprint, thereby increasing the additional value in utility of the array substrate.

It is to be noted that according to an array substrate provided by some embodiments of the present application, when a fingerprint operation or gesture operation is present, the ultrasonic reception sensor identifies the fingerprint or gesture by receiving ultrasonic waves reflected by the finger, while when a fingerprint operation or gesture operation is not present, the ultrasonic reception sensor does not receive ultrasonic waves, wherein projections of the ultrasonic emission sensor and the ultrasonic reception sensor in a direction perpendicular to the substrate do not overlap with each other, i.e., to ensure that the ultrasonic waves emitted by the ultrasonic emission sensor are not received directly by the ultrasonic reception sensor, so that the result of fingerprint identification or gesture identification would not be affected.

Figure 2:
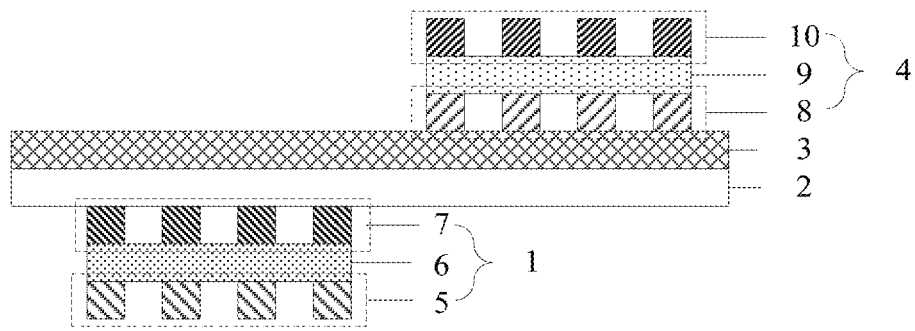
FIG. 2 is a schematic diagram showing the structure of a second array substrate provided by some embodiments of the present application.

In some embodiments, as shown in FIG. 2, the ultrasonic emission sensor 1 comprises: a first drive electrode layer 5, a first piezoelectric layer 6 over the first drive electrode layer 5, and a second drive electrode layer 7 over the first piezoelectric layer 6; the ultrasonic reception sensor 4 comprises: a first sensing electrode layer 8, a second piezoelectric layer 9 over the first sensing electrode layer 8, and a second sensing electrode layer 10 over the second piezoelectric layer 9.

The first drive electrode layer, second drive electrode layer, first sensing electrode layer and second sensing electrode layer may be made of aluminum (Al), molybdenum (Mo), copper (Cu), an rubidium aluminum alloy (AlNd) or MoAlMo. The first piezoelectric layer and the second piezoelectric layer may be made of an organic material such as polyvinylidene fluoride (PVDF) or an inorganic material such as barium titanate.

On an array substrate as shown in FIG. 2, the first piezoelectric layer 6 and the second piezoelectric layer 9 are made of the same material and have the same thickness.

It is to be noted that on an array substrate as shown in FIG. 2, the ultrasonic emission sensor and the ultrasonic reception sensor are both piezoelectric ultrasonic sensors that have the following principle: in an ultrasonic emission mode, an inverse piezoelectric effect is used, and a voltage pulse signal is applied between electrodes, which would result in deformation of the piezoelectric layer, and when the voltage pulse signal has a frequency equal to the innate frequency of a material for the piezoelectric layer, resonance occurs, causing vibration of the medium around the piezoelectric layer, and generating ultrasonic waves; in an ultrasonic reception mode, a positive piezoelectric effect is used, and when the ultrasonic frequency received by the piezoelectric layer is consistent with the innate frequency of a material for the piezoelectric layer, deformation of the piezoelectric layer occurs, generating a high-frequency voltage, and the generated voltage may be outputted by an amplification circuit. In some embodiments of the present application, the frequency of the ultrasonic wave reflected by the fingerprint and received by the ultrasonic reception sensor is consistent with the frequency of the ultrasonic wave emitted by the ultrasonic emission sensor. It is desired that the innate frequency of the ultrasonic reception sensor and that of the ultrasonic emission sensor be identical, wherein the innate frequency of the piezoelectric ultrasonic sensor is associated with the material and thickness of the piezoelectric layer. Thus, for a sensor having a single function, for example, a single function of fingerprint identification or gesture identification, it is desired that the first piezoelectric layer and the second piezoelectric layer are made of the same material and have the same thickness.

An array substrate provided by some embodiments of the present application may have both a function of gesture identification and a function of fingerprint identification. High-frequency ultrasonic waves have weak penetration and fast attenuation, which can be used for near-distance communications and are adaptable for fingerprint identification. Thus, for fingerprint identification, the ultrasonic emission sensor shall have an innate frequency in a range of 10 MHz to 25 MHz, i.e., it is desired that the ultrasonic emission sensor emits high-frequency ultrasonic waves. Low-frequency ultrasonic waves have strong penetration and slow attenuation, which can be used for long-distance communications and are adaptable for gesture identification. Thus, for gesture identification, the ultrasonic emission sensor shall have an innate frequency in a range of 20 KHz to 50 KHz, i.e., it is desired that the ultrasonic emission sensor emits low-frequency ultrasonic waves. The innate frequency of the piezoelectric ultrasonic sensor is associated with the material and thickness of the piezoelectric layer. When the material of the piezoelectric layer is determined, the thicker the piezoelectric layer is, the lower the frequency of the ultrasonic waves emitted by the sensor becomes; when the thickness of the piezoelectric layer is determined, the larger the frequency constant of the material for the piezoelectric layer is, the higher the frequency of the ultrasonic waves emitted by the sensor becomes.

Figure 3:
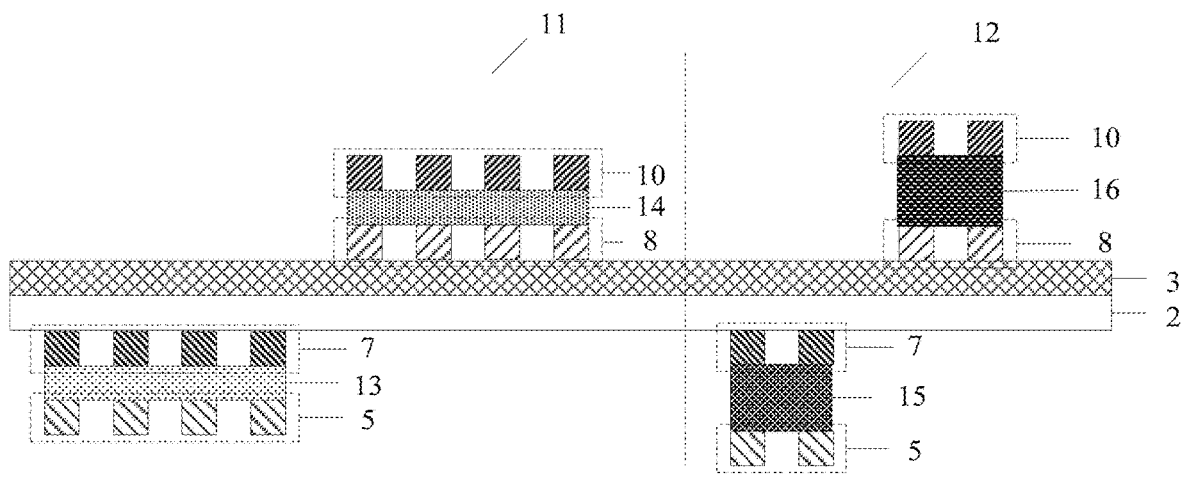
FIG. 3 is a schematic diagram showing the structure of a third array substrate provided by some embodiments of the present application.

In some embodiments, as shown in FIG. 3, the first piezoelectric layer 13 in a display area 11 and the first piezoelectric layer 15 in a non-display area 12 are made of the same material, and the first piezoelectric layer 13 in the display area 11 has a thickness less than that of the first piezoelectric layer 15 in the non-display area 12; correspondingly, the second piezoelectric layer 14 in the display area 11 and the second piezoelectric layer 16 in the non-display area 12 are made of the same material, and the second piezoelectric layer 14 in the display area 11 has a thickness less than that of the second piezoelectric layer 16 in the non-display area 12.

According to an array substrate provided by some embodiments of the present application as shown in FIG. 3, the piezoelectric ultrasonic sensor in the display area and the piezoelectric ultrasonic sensor in the non-display area are made of the same material, and a thickness of the piezoelectric ultrasonic sensor in the non-display area is larger than that of the piezoelectric ultrasonic sensor in the display area, such that the piezoelectric ultrasonic sensor in the display area has an innate frequency higher than that of the piezoelectric ultrasonic sensor in the non-display area, thereby enabling fingerprint identification in the display area and gesture identification in the non-display area. That is, the array substrate can realize two functions, i.e., fingerprint identification and gesture identification. Furthermore, integration of the ultrasonic sensor for fingerprint identification and the ultrasonic sensor for gesture identification with the array substrate enables the array substrate to have the two functions of fingerprint identification and gesture identification in addition to the function of displaying, which further increases the additional value in utility of the array substrate.

It is to be noted that on an array substrate provided by some embodiments of the present application, two kinds of ultrasonic sensors are provided, which both emit ultrasonic waves having a frequency consistent with the innate frequency of the respective sensor. When a frequency of the drive voltage applied to the ultrasonic emission sensor is consistent with the innate frequency of the sensor, the sensor is resonant and can function to the greatest extent, enabling a high conversion efficiency for the sensor. Thus, on an array substrate provided by some embodiments of the present application, two sensors having different functions are provided, and drive voltages having a frequency consistent with the innate frequency of the respective sensor are applied to the two sensors, such that each sensor emits ultrasonic waves having a frequency equal to its innate frequency, ensuring conversion efficiency of the sensor at the same time of enabling the two functions of fingerprint identification and gesture identification for the array substrate.

Figure 4:
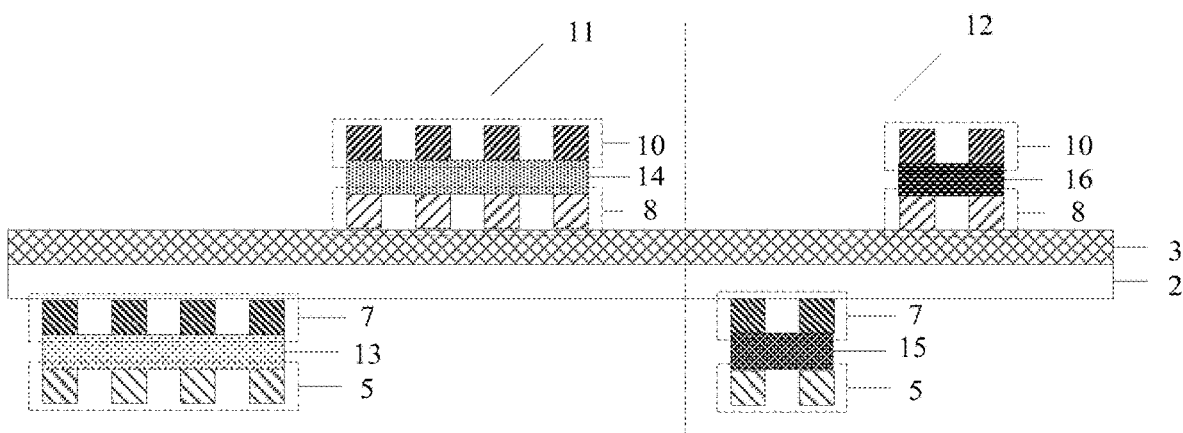
FIG. 4 is a schematic diagram showing the structure of a fourth array substrate provided by some embodiments of the present application.

In some embodiments, as shown in FIG. 4, the first piezoelectric layer 13 in a display area 11 and the first piezoelectric layer 15 in a non-display area 12 have the same thickness, and the first piezoelectric layer 13 in the display area 11 is made of a material having a frequency constant larger than that of a material for the first piezoelectric layer 15 in the non-display area 12; the second piezoelectric layer 14 in the display area 11 and the second piezoelectric layer 16 in a non-display area 12 have the same thickness, and the second piezoelectric layer 14 in the display area 11 is made of a material having a frequency constant larger than that of a material for the second piezoelectric layer 16 in the non-display area 12.

On an array substrate provided according to some embodiments of the present application as shown in FIG. 4, the piezoelectric ultrasonic sensor in the display area and the piezoelectric ultrasonic sensor in the non-display area have the same thickness, and a frequency constant of the piezoelectric material in the ultrasonic sensor in the non-display area is less than that of the piezoelectric material in the ultrasonic sensor in the display area, such that the piezoelectric ultrasonic sensor in the display area has an innate frequency higher than that of the piezoelectric ultrasonic sensor in the non-display area, thereby enabling fingerprint identification in the display area and gesture identification in the non-display area. That is, the array substrate can realize two functions, i.e., fingerprint identification and gesture identification. Furthermore, integration of the ultrasonic sensor for fingerprint identification and the ultrasonic sensor for gesture identification with the array substrate enables the array substrate to have the two functions of fingerprint identification and gesture identification in addition to the function of displaying, which further increases the additional value in utility of the array substrate.

It is to be noted that, on an array substrate provided by some embodiments of the present application as shown in FIGS. 3 and 4, as long as the settings of the material and thickness of the first piezoelectric layer and the second piezoelectric layer satisfy the following conditions: an innate frequency of the ultrasonic sensor in the display area is adaptable for fingerprint identification and an innate frequency of the ultrasonic sensor in the non-display area is adaptable for gesture identification, the present application does not set specific limitations thereon.

It is to be further noted that on an array substrate provided by some embodiments of the present application, an ultrasonic sensor for fingerprint identification is provided in the display area and an ultrasonic sensor for gesture identification is provided in the non-display area. However, in practice, it is possible that an ultrasonic sensor for fingerprint identification is provided in the non-display area of the array substrate and an ultrasonic sensor for gesture identification is provided in the display area of the array substrate. However, generally an area of the display area of the array substrate is larger than an area of the non-display area thereof, so the solution provided by some embodiments of the present application can better enable full-screen fingerprint identification. Moreover, ultrasonic waves for gesture identification can be used for long-distance communications and have a large detecting angle, so the setting of an ultrasonic sensor for gesture identification in the non-display area can enable full-screen gesture identification. The settings of the ultrasonic sensor for gesture identification and the ultrasonic sensor for fingerprint identification on the array substrate provided by some embodiments of the present application can enable both full-screen fingerprint identification and full-screen gesture identification.

In some embodiments, on an array substrate provided by some embodiments of the present application, projections of the first sensing electrode layer and the second sensing electrode layer in a direction perpendicular to substrate overlap with a projection of the non-display area of the array substrate in the direction perpendicular to the substrate.

It is to be noted that the settings of the first sensing electrode layer and the second sensing electrode layer in the ultrasonic sensor should not affect the display effect. Thus, the electrodes in the first sensing electrode layer and the second sensing electrode layer are set at intervals to ensure that each separate electrode in the first sensing electrode layer and the second sensing electrode layer does not cover the display area in the pixel unit on the array substrate. The position where the ultrasonic emission sensor is provided and the way of setting it do not affect the display effect. On an array substrate provided by some embodiments of the present application as shown in FIGS. 2, 3 and 4, the first drive electrode layer and the second drive electrode layer include a plurality of bar-shaped drive electrodes that are arranged in parallel to one another, and the first sensing electrode layer and the second sensing electrode layer include a plurality of bar-shaped sensing electrodes that are arranged in parallel to one another. Of course, sub-electrodes in the first sensing electrode layer and the second sensing electrode layer may have other shapes, as long as the first sensing electrode layer and the second sensing electrode layer do not cover the display area of the pixel unit.

Figure 5:
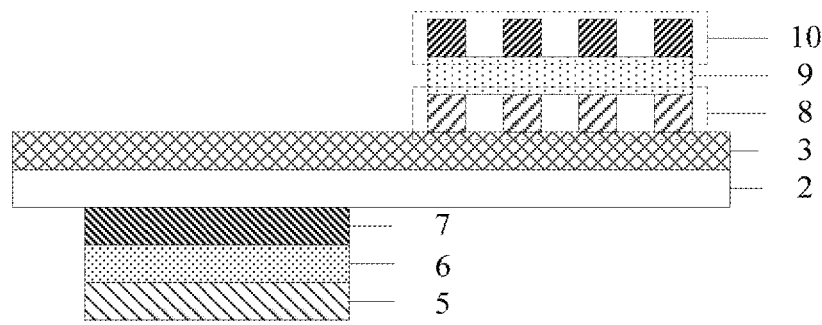
FIG. 5 is a schematic diagram showing the structure of a fifth array substrate provided by some embodiments of the present application.

However, electrodes in the first drive electrode layer 5 and the second drive electrode layer 7 may be set not at intervals. As shown in FIG. 5, the first drive electrode layer 5 and the second drive electrode layer 7 may also be planar electrodes, i.e., the first drive electrode layer 5 and the second drive electrode layer 7 each include continuous electrodes that occupy an entire plane.

In some embodiments, on an array substrate as shown in FIG. 2, 3, 4 or 5, in the first sensing electrode layer and the second sensing electrode layer, each pair of bar-shaped sensing electrodes whose projections overlap with each other is electrically connected to a diode in the pixel circuit.

Figure 6:
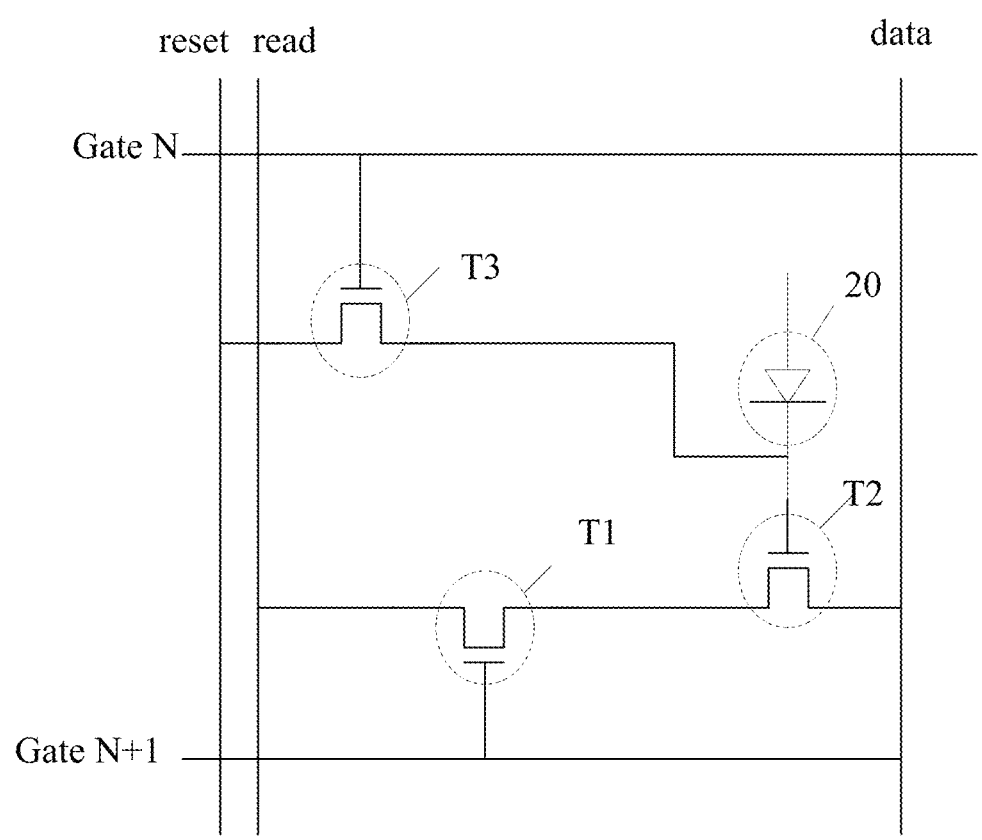
FIG. 6 is a schematic diagram showing the structure of a pixel circuit of the array substrate provided by some embodiments of the present application.

On an array substrate provided by some embodiments of the present application, the pixel circuit layer comprises a thin film transistor (TFT) and a diode. For example, the pixel circuit structure corresponding to each pixel unit comprises three TFTs and one diode, and the fingerprint identification or gesture identification by the array substrate provided by some embodiments of the present application is illustrated. As shown in FIG. 6, the pixel circuit comprises three thin film transistors, T1, T2, T3, and a diode 20. Gate N and Gate N+1 represent two neighboring gate lines. The two terminals of the diode 20 are connected to a pair of electrodes (not shown) in the first sensing electrode layer and the second sensing electrode layer in the ultrasonic reception sensor. At the time of fingerprint identification or gesture identification, when the ultrasonic reception sensor receives ultrasonic waves reflected by the finger, the voltage generated by it is led out by the diode. The principle for the detection of the pixel circuit is as follows.

First stage: applying a high level to Gate N, T3 is turned on, a signal of the reset line is transmitted via T3 to the gate of T2 and an N terminal of the PN junction of the diode, and electrodes in the first sensing electrode layer and the second sensing electrode layer are initialized, T2 is turned-off.

Second state: applying a low level to Gate N and a high level to Gate N+1, T3 is turned off and T1 is turned on; in the case of no fingerprint operation or gesture operation, the gate of T2 is maintained at a low level, T2 is turned off, a read line signal is not changed; and in case of a fingerprint operation or gesture operation, the ultrasonic reception sensor receives ultrasonic waves reflected by the finger, such that deformation of the piezoelectric layer in the ultrasonic reception layer occurs, thus generating a high-frequency voltage; T2 is turned on by applying a high level to the gate of T2 via the diode, the read line reads signal on the data line, i.e., the read line signal changes.

Some of the embodiments of the present application provide a display panel comprising an array substrate provided by some embodiments of the present application.

For example, a display panel provided by some embodiments of the present application may be a liquid crystal display panel or an organic light-emitting diode (OLED) display panel.

Some of the embodiments of the present application provide a display device comprising a display panel provided by some embodiments of the present application.

For example, the display device in some embodiments of the present application may be a device such as a mobile phone, a television, or a computer.

Figure 7:
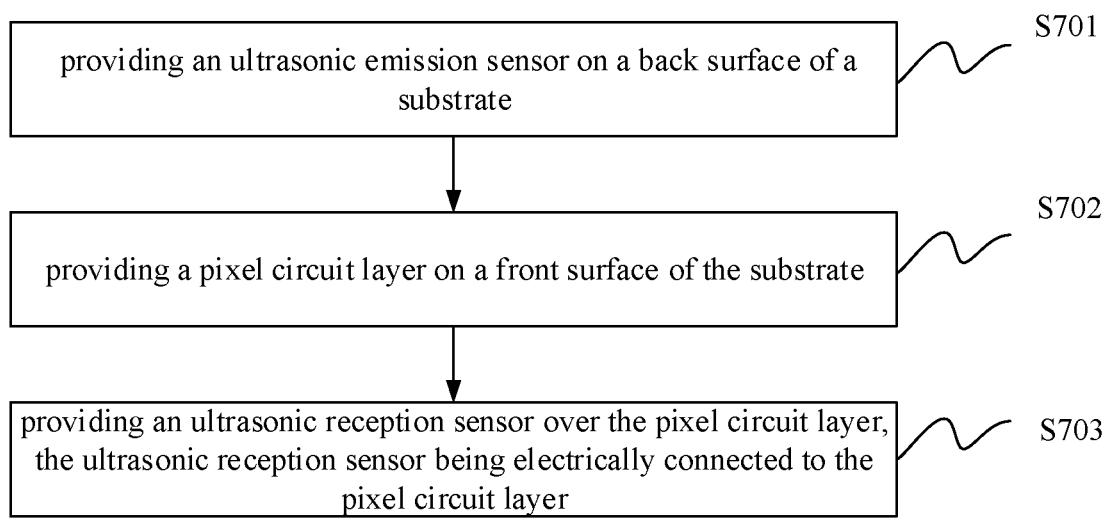
FIG. 7 is a flow chart showing a method for manufacturing an array substrate provided by some embodiments of the present application.

Corresponding to the array substrate provided by some embodiments of the present application, some embodiments of the present application further provide a method for manufacturing an array substrate, which, as shown in FIG. 7, may comprise the following steps.

In S701, an ultrasonic emission sensor is provided on a back surface of a substrate (e.g., a glass substrate).

In S702, a pixel circuit layer (e.g., a TFT pixel circuit layer) is provided on a front surface of the substrate.

In S703, an ultrasonic reception sensor is provided over the pixel circuit layer, the ultrasonic reception sensor being electrically connected to the pixel circuit layer.

Projections of the ultrasonic emission sensor and the ultrasonic reception sensor in a direction perpendicular to the substrate do not overlap with each other.

In the method for manufacturing an array substrate provided according to some embodiments of the present application, an ultrasonic emission sensor is provided on a back surface of the substrate, a pixel circuit layer is provided on a front surface of the substrate, and an ultrasonic reception sensor is provided over the pixel circuit layer, such that the gesture-identifying and/or fingerprint-identifying ultrasonic sensors are integrated with the array substrate. Thus, it is unnecessary to provide apparatuses or modules in addition to the array substrate for gesture identification and/or fingerprint identification. In addition to a display function, the array substrate can also identify a gesture and/or fingerprint, thereby increasing the additional value in utility of the array substrate.

The method for manufacturing an array substrate that enables both fingerprint identification and gesture identification as provided by the present application is illustrated as follows.

Taking the array substrate as shown in FIG. 3 as an example, an ultrasonic sensor for fingerprint identification is provided in a display area, and an ultrasonic sensor for gesture identification is provided in a non-display area, wherein the first piezoelectric layer and the second piezoelectric layer in the display area and the non-display area are made of the same material but have different thicknesses, the first piezoelectric layer and the second piezoelectric layer being made of PVDF.

Figure 8:
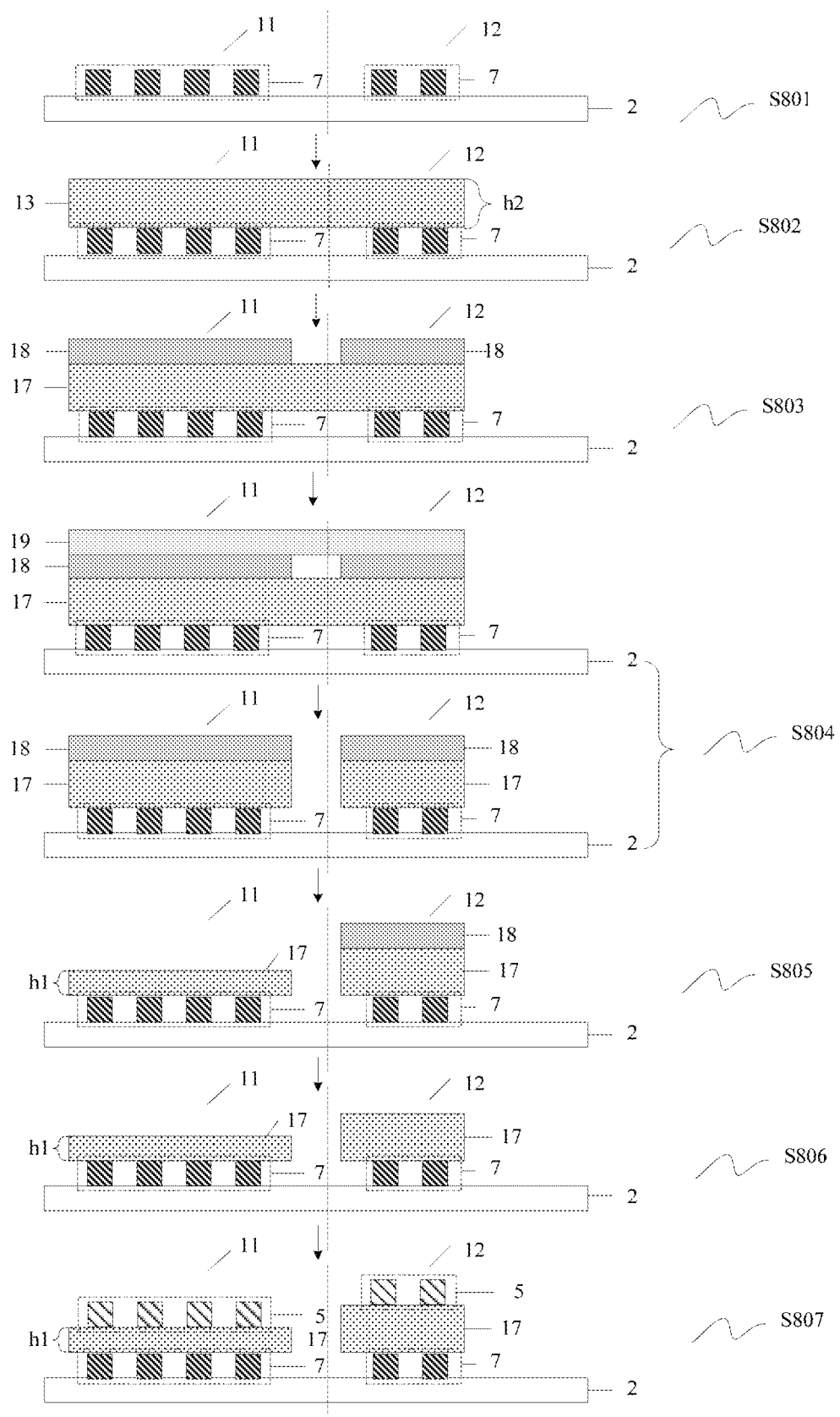
FIG. 8 is a flow chart showing a method for manufacturing the ultrasonic reception sensor in an array substrate as shown in FIG. 3 provided by some embodiments of the present application.

As shown in FIG. 8, providing an ultrasonic emission sensor on a back surface of the substrate (e.g., a glass substrate) comprises the following steps.

In S801, a second drive electrode layer 7 is formed on a back surface of the substrate 2 by deposition and etching.

In S802, a PVDF layer 17 is provided over the second drive electrode layer, the PVDF layer 17 having a thickness of h2, wherein h2 is a thickness of the piezoelectric layer in the ultrasonic emission sensor for gesture identification.

In S803, a metal mask 18 is deposited and etched on the PVDF layer 17, such that the metal mask is disconnected at a boundary position between the display area 11 and the non-display area 12.

In S804, a photoresist 19 is coated and exposed, and after that, the PVDF layer at the boundary between the display area 11 and the non-display area 12 is etched by an oxygen drying method, such that the PVDF layer 17 of the ultrasonic sensor for fingerprint identification is separated from the PVDF layer 17 of the ultrasonic sensor for gesture identification.

It is to be noted that a common material for the photoresist is similar to the material for the PVDF. In order to avoid erroneous etching on the PVDF material, a metal mask on the PVDF is provided for protecting the PVDF.

In S805, the metal mask on the PVDF layer 17 in the display area 11 is wet etched, and then a thickness of h2-h1 is etched off from the PVDF layer 17 in the display area by an oxygen drying method, thereby obtaining a piezoelectric layer of the ultrasonic sensor for fingerprint identification having a thickness of h1.

In S806, the metal mask on the PVDF layer 17 in the non-display area 12 is wet etched.

In S807, a first drive electrode layer 5 is deposited and etched on the PVDF layer 17 in the display area 11 and the non-display area 12.

Figure 9:
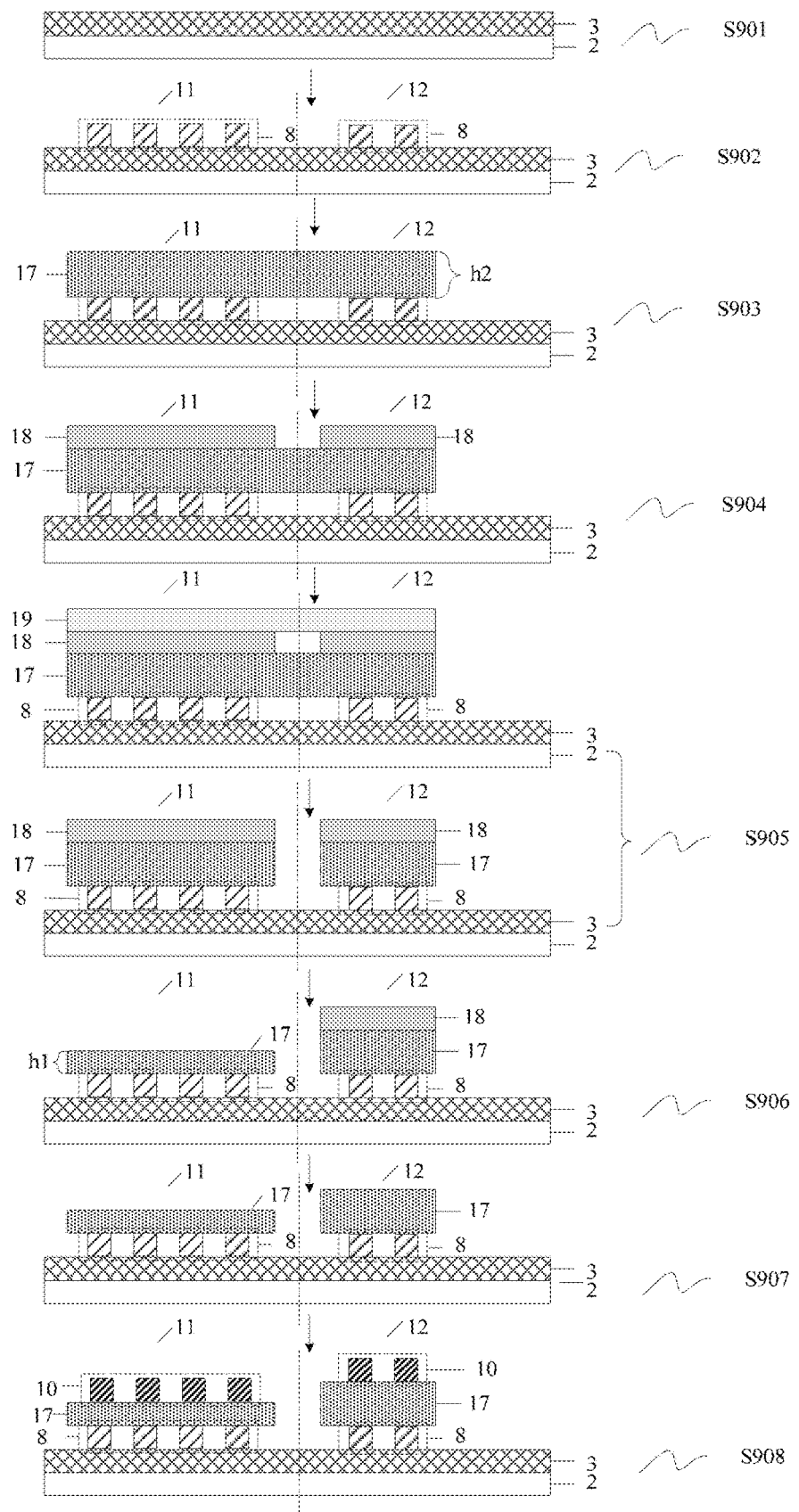
FIG. 9 is a flow chart showing a method for manufacturing the ultrasonic emission sensor in an array substrate as shown in FIG. 3 provided by some embodiments of the present application.

The process for setting the ultrasonic reception sensor is the same as that for setting the ultrasonic emission sensor. As shown in FIG. 9, providing a pixel circuit layer (e. g., a TFT pixel circuit layer) and an ultrasonic reception sensor on a front surface of the substrate may comprise the following steps.

In S901, a pixel circuit (e. g., a TFT pixel circuit) is deposited and etched on a front surface of a substrate (e.g., a glass substrate) 2 to form a pixel circuit layer (e. g., a TFT pixel circuit layer) 3.

In S901, a first sensing electrode layer 8 is formed on the pixel circuit layer 3 by deposition and etching.

In S903, a PVDF layer 17 is provided over the first sensing electrode layer, the PVDF layer 17 having a thickness of h2, wherein h2 is a thickness of the piezoelectric layer in the ultrasonic sensor for gesture identification.

In S904, a metal mask 18 is deposited and etched on the PVDF layer 17, such that the metal mask is disconnected at a boundary position between the display area 11 and the non-display area 12;

In S905, a photoresist 19 is coated and exposed, and after that, the PVDF layer at the boundary between the display area and the non-display area is etched by an oxygen drying method, such that the PVDF layer 17 of the ultrasonic sensor for fingerprint identification is separated from the PVDF layer 17 of the ultrasonic sensor for gesture identification.

In S906, the metal mask on the PVDF layer 17 in the display area 11 is wet etched, and then a thickness of h2-h1 is etched off from the PVDF layer 17 in the display area by an oxygen drying method, thereby obtaining a PVDF layer 17 of the ultrasonic sensor for fingerprint identification having a thickness of h1.

In S907, the metal mask on the PVDF layer 17 in the non-display area 12 is wet etched.

In S908, a second sensing electrode layer 10 is deposited and etched on the PVDF layer 17 in the display area 11 and the non-display area 12.

In summary, the present application provides in some embodiments an array substrate, a display panel, a display device and a method for manufacturing the array substrate, in which ultrasonic sensors for gesture identification and/or fingerprint identification are integrated with the array substrate, such that in addition to a display function, the array substrate can also identify a gesture and/or fingerprint, thereby increasing the additional value in utility of the array substrate. Furthermore, on an array substrate provided according to some embodiments of the present application as shown in FIGS. 3 and 4, the piezoelectric layer of the ultrasonic sensor in the display area and the piezoelectric layer of the ultrasonic sensor in the non-display area are made of the same material, and a thickness of the piezoelectric layer of the ultrasonic sensor in the non-display area is larger than that of the piezoelectric layer of the ultrasonic sensor in the display area, or the piezoelectric layer of the ultrasonic sensor in the display area and the piezoelectric layer of the ultrasonic sensor in the non-display area have the same thickness, and a frequency constant of the piezoelectric material in the ultrasonic sensor in the non-display area is less than that of the piezoelectric material in the ultrasonic sensor in the display area, such that the piezoelectric ultrasonic sensor in the display area has an innate frequency higher than that of the piezoelectric ultrasonic sensor in the non-display area, thereby enabling fingerprint identification in the display area and gesture identification in the non-display area. That is, the array substrate can realize two functions, i.e., fingerprint identification and gesture identification. Furthermore, integration of the ultrasonic sensor for fingerprint identification and the ultrasonic sensor for gesture identification with the array substrate enables the array substrate to have the two functions of fingerprint identification and gesture identification in addition to the function of displaying, which further increases the additional value in utility of the array substrate. Moreover, on an array substrate provided by some embodiments of the present application, two kinds of ultrasonic sensors having different functions are provided, and a frequency of the drive voltage applied to the one ultrasonic sensor is consistent with the innate frequency of the respective sensor, such that each ultrasonic sensor emits ultrasonic waves having a frequency equal to its innate frequency, thereby ensuring the conversion efficiency of the ultrasonic sensor at the same time of enabling fingerprint identification and gesture identification.

It will be apparent to those skilled in the art that various modifications and variations can be made to the present disclosure without departing from the spirits and scope of the present application. In this case, if the modifications and variations made to the present disclosure fall within the scope of the claims of the present disclosure and equivalents thereof, the present application is intended to include these modifications and variations.

What is claimed is:

1. An array substrate, the array substrate including a display area and a non-display area, the array substrate comprising:
    an ultrasonic emission sensor;
    a substrate over the ultrasonic emission sensor;
    a pixel circuit layer over the substrate; and
    an ultrasonic reception sensor over the pixel circuit layer, the ultrasonic reception sensor being electrically connected to the pixel circuit layer;
    wherein projections of the ultrasonic emission sensor and the ultrasonic reception sensor in a direction perpendicular to the substrate do not overlap with each other;
    wherein the ultrasonic emission sensor comprises a first drive electrode layer, a first piezoelectric layer over the first drive electrode layer, and a second drive electrode layer over the first piezoelectric layer; and
    wherein a thickness of the first piezoelectric layer in the display area is the same as a thickness of the first piezoelectric layer in the non-display area, and a material of the first piezoelectric layer in the display area has a frequency constant larger than that of a material of the first piezoelectric layer in the non-display area.

2. The array substrate according to claim 1 wherein the first drive electrode layer and the second drive electrode layer include a plurality of bar-shaped drive electrodes that are arranged in parallel with one another.

3. The array substrate according to claim 1, wherein the first drive electrode layer and the second drive electrode layer are planar drive electrodes.

4. The array substrate according to claim 1, wherein the ultrasonic reception sensor comprises:
    a first sensing electrode layer;
    a second piezoelectric layer over the first sensing electrode layer; and
    a second sensing electrode layer over the second piezoelectric layer.

5. The array substrate according to claim 4, wherein the first piezoelectric layer and the second piezoelectric layer are made of a same material and have a same thickness.

6. The array substrate according to claim 4, wherein a material of the second piezoelectric layer in the display area is the same as a material of the second piezoelectric layer in the non-display area, and a thickness of the second piezoelectric layer in the display area is less than a thickness of the second piezoelectric layer in the non-display area.

7. The array substrate according to claim 4, wherein a material of the second piezoelectric layer in the display area is the same as a material of the second piezoelectric layer in the non-display area, and a material of the second piezoelectric layer in the display area has a frequency constant larger than that of a material of the second piezoelectric layer in the non-display area.

8. The array substrate according to claim 4, wherein the first sensing electrode layer and the second sensing electrode layer include a plurality of bar-shaped sensing electrodes that are arranged in parallel with one another.

9. The array substrate according to claim 8, wherein projections of the first sensing electrode layer and the second sensing electrode layer in the direction perpendicular to the substrate overlap with a projection of the non-display area of the array substrate in the direction perpendicular to the substrate.

10. The array substrate according to claim 8, wherein the pixel circuit layer comprises a thin film transistor (TFT) and a diode, in the first sensing electrode layer and the second sensing electrode layer, each pair of bar-shaped sensing electrodes whose projections overlap with each other is electrically connected to the diode.

11. A display panel, comprising an array substrate according to claim 1.

12. A display device, comprising a display panel according to claim 11.

13. A method for manufacturing an array substrate, comprising:
- providing an ultrasonic emission sensor on a back surface of a substrate;
- providing a pixel circuit layer on a front surface of the substrate; and
- providing an ultrasonic reception sensor over the pixel circuit layer, the ultrasonic reception sensor being electrically connected to the pixel circuit layer;
- wherein projections of the ultrasonic emission sensor and the ultrasonic reception sensor in a direction perpendicular to the substrate do not overlap with each other;
- wherein the ultrasonic emission sensor comprises a first drive electrode layer, a first piezoelectric layer over the first drive electrode layer, and a second drive electrode layer over the first piezoelectric layer; and
- wherein a thickness of the first piezoelectric layer in the display area is the same as a thickness of the first piezoelectric layer in the non-display area, and a material of the first piezoelectric layer in the display area has a frequency constant larger than that of a material of the first piezoelectric layer in the non-display area.

14. The array substrate according to claim 4, wherein a first piezoelectric layer of the ultrasonic emission sensor and the second piezoelectric layer are made of a same material and have a same thickness.

* * * * *